(12) United States Patent
Kim et al.

(10) Patent No.: US 7,064,484 B2
(45) Date of Patent: Jun. 20, 2006

(54) ORGANIC EL DEVICE

(75) Inventors: Myung Seop Kim, Seoul (KR); Won Jun Song, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/686,732

(22) Filed: Oct. 17, 2003

(65) Prior Publication Data

US 2004/0081855 A1 Apr. 29, 2004

(30) Foreign Application Priority Data

Oct. 18, 2002 (KR) .................. 10-2002-0063949

(51) Int. Cl.
*H05B 33/00* (2006.01)
*H01L 51/50* (2006.01)
(52) U.S. Cl. ...................... 313/512; 313/504
(58) Field of Classification Search ........ 313/500–512, 313/346 R, 498; 428/690
See application file for complete search history.

(56) References Cited

U.S. PATENT DOCUMENTS

| 5,912,061 | A | * | 6/1999 | Uchida et al. | ............. 428/64.3 |
| 6,522,067 | B1 | * | 2/2003 | Graff et al. | .................. 313/512 |
| 2001/0000005 | A1 | * | 3/2001 | Forrest et al. | .............. 313/506 |
| 2002/0113241 | A1 | * | 8/2002 | Kubota et al. | ................ 257/79 |
| 2002/0180350 | A1 | * | 12/2002 | Furugori et al. | ............ 313/506 |
| 2004/0043252 | A1 | * | 3/2004 | Kido et al. | .................. 313/506 |

FOREIGN PATENT DOCUMENTS

JP 9281517 10/1997

* cited by examiner

*Primary Examiner*—Joseph Williams

(74) *Attorney, Agent, or Firm*—Fleshner & Kim, LLP

(57) ABSTRACT

Top emission type organic EL device including a substrate, a first electrode on the substrate, an organic emitting layer on the first electrode, and a second electrode on the organic emitting layer having a stack of at least one transparent thin film layer.

29 Claims, 5 Drawing Sheets

ORGANIC EL DEVICE

This application claims the benefit of the Korean Application No. P2002-0063949 filed on Oct. 18, 2002, which is hereby incorporated by reference.

BACKGROUND OF THE INVENTION

1. Field of the Invention

The present invention relates to a top emission type organic electroluminescence (EL) device.

2. Background of the Related Art

The organic EL device has advantages in that a low voltage operation is possible and power consumption is small. FIG. 1 illustrates a section of a related art top emission type organic EL device.

Referring to FIG. 1, an anode 2 is formed on a transparent substrate 1. The anode 2 is formed of ITO (indium tin oxide), mostly. A hole injecting layer (HIL) 3 is formed on the anode 2. The HIL 3 is formed of approx. 10–30 nm thick CuPc (copper phthalocyanine).

Then, a hole transport layer (HTL) 4 is formed on the HIL 3. The HTL 4 is formed of approx. 30–60 nm thick N,N'-diphenyl-N,N'bis(3-methylphenyl)-(1-1'-biphenyl)4,4'-diamine (TPD), or 4,4'-bis[N-(1-naphthyl)-N-phenyl-amino] biphenyl(NPD).

Then, an organic emitting layer 5 is formed on the HTL 4, and an electron transport layer (ETL) 6 and an electron injecting layer (EIL) 7 are formed on the organic emitting layer 5 in succession. The electron injecting layer 7 is formed of approx. 5 Å thick LiF or $Li_2O$, or approx. 200 Å thick alkali metal or alkali earth metal, such as Li, CA, Mg, Sm and the like.

Then, a cathode 8 is formed on the electron injecting layer 7. The cathode 8 is formed of approx. 1000 Å thick ITO, or IZO.

Thus, since the top emission type organic EL device is required that a light emitted from the organic emitting layer transmits toward the cathode, the cathode is formed of transparent material, such as ITO, or IZO.

An oxide film of ITO or IZO is very sensitive to a temperature. Therefore, for better electrooptic characteristics of the oxide film, it is required to maintain a temperature of the substrate in a range of approx. 200–300° C. in formation of the cathode. However, because an organic material, like the organic emitting layer, is susceptible to a high temperature, it is required to maintain a temperature of the substrate in a range of 100° C. in formation of the cathode, which results in poor electrooptic characteristics of the cathode of an oxide film.

SUMMARY OF THE INVENTION

Accordingly, the present invention is directed to a top emission type organic EL device that substantially obviates one or more of the problems due to limitations and disadvantages of the related art.

An object of the present invention is to provide a top emission type organic EL device having improved electrooptic characteristics.

Additional features and advantages of the invention will be set forth in the description which follows, and in part will be apparent to those having ordinary skill in the art upon examination of the following or may be learned from practice of the invention. The objectives and other advantages of the invention will be realized and attained by the structure particularly pointed out in the written description and claims hereof as well as the appended drawings.

To achieve these objects and other advantages and in accordance with the purpose of the present invention, as embodied and broadly described herein, the organic EL device includes a substrate, a first electrode on the substrate, an organic emitting layer on the first electrode, and a second electrode on the organic emitting layer having a stack of at least one transparent thin film layer.

The transparent thin film layer of the second electrode includes a first layer of a metal, and a second layer of a transparent material, and the first layer and the second layer are stacked alternately.

The first layer is formed of a material selected from Ag, Al, Cr, Mo, Au, Pt, Sn, Ln, Mg and Al:Li, Ag:Mg, Ag:Li, and the second layer is formed of a material selected from ITO, IZO, $TiO_2$, $SiO_2$, and $Si_3N_4$.

The transparent thin film layer of the second electrode includes 1–100 layers in total.

In another aspect of the present invention, there is provided an organic EL device including a substrate, a first electrode on the substrate, an organic emitting layer on the first electrode, a second electrode on the organic emitting layer having alternate stack of at least on metal layer and at least a transparent thin film layer, and a protection film on the second electrode having a stack of at least one transparent thin film layer.

The metal layer of the second electrode is formed of a material selected from Ag, Al, Cr, Mo, Au, Pt, Sn, Ln, and Mg, and Al:Li, Ag:Mg, Ag:Li, and the transparent thin film layer is formed of a material selected from ITO, IZO, $TiO_2$, $SiO_2$, and $Si_3N_4$.

The transparent thin film layer of the protection film includes four layers in total, wherein the first layer of the protection film is formed of a material selected from a polymer including fluorine, stearly acrylate, lauryl acrylate, 2-phenoxyethyl acrylate, isodecyl acrylate, isooctyl acrylate, iso bornly acrylate, 1,3-butylene glycol acrylate, 1,4-butanediol diacrylate, 1,6-hexanediol diacrylate, ethoxylated bisphenol A diacrylate, propoxylated neophenyl, glycol diacrylate, tris(2-hydroxylethyl) isocyannurate triacrylate, and trimethylolpropane triacrylate, the second layer of the protection film is formed of a material selected from SiC, SiO, $SiO_2$, and $Si_xN_y$, the third layer of the protection film is formed of a sealant of a silicon compound of an expoxy group or an acryl group, and the fourth layer of the protection film is formed of a material selected from PET, PMMA, and a polymer of a fluorine group.

It is to be understood that both the foregoing description and the following detailed description of the present invention are exemplary and explanatory and are intended to provide further explanation of the invention claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Figure 1:
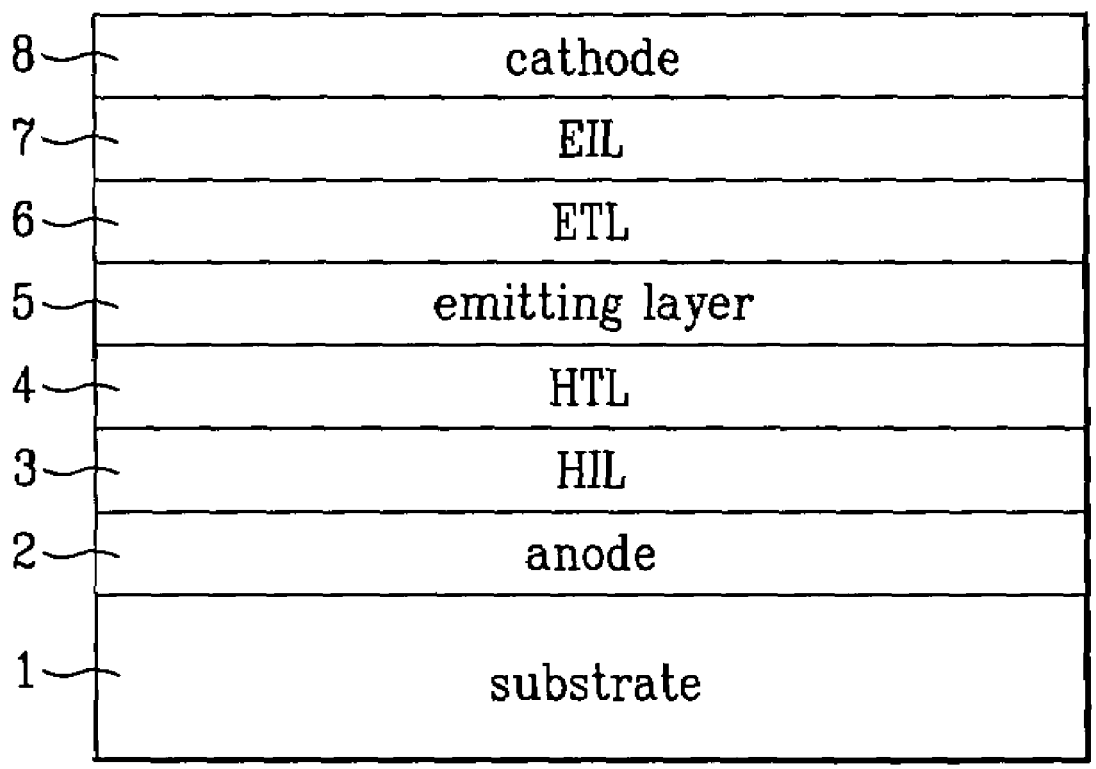
FIG. 1 illustrates a section of a related art top emission type organic EL device.
Figure 2:
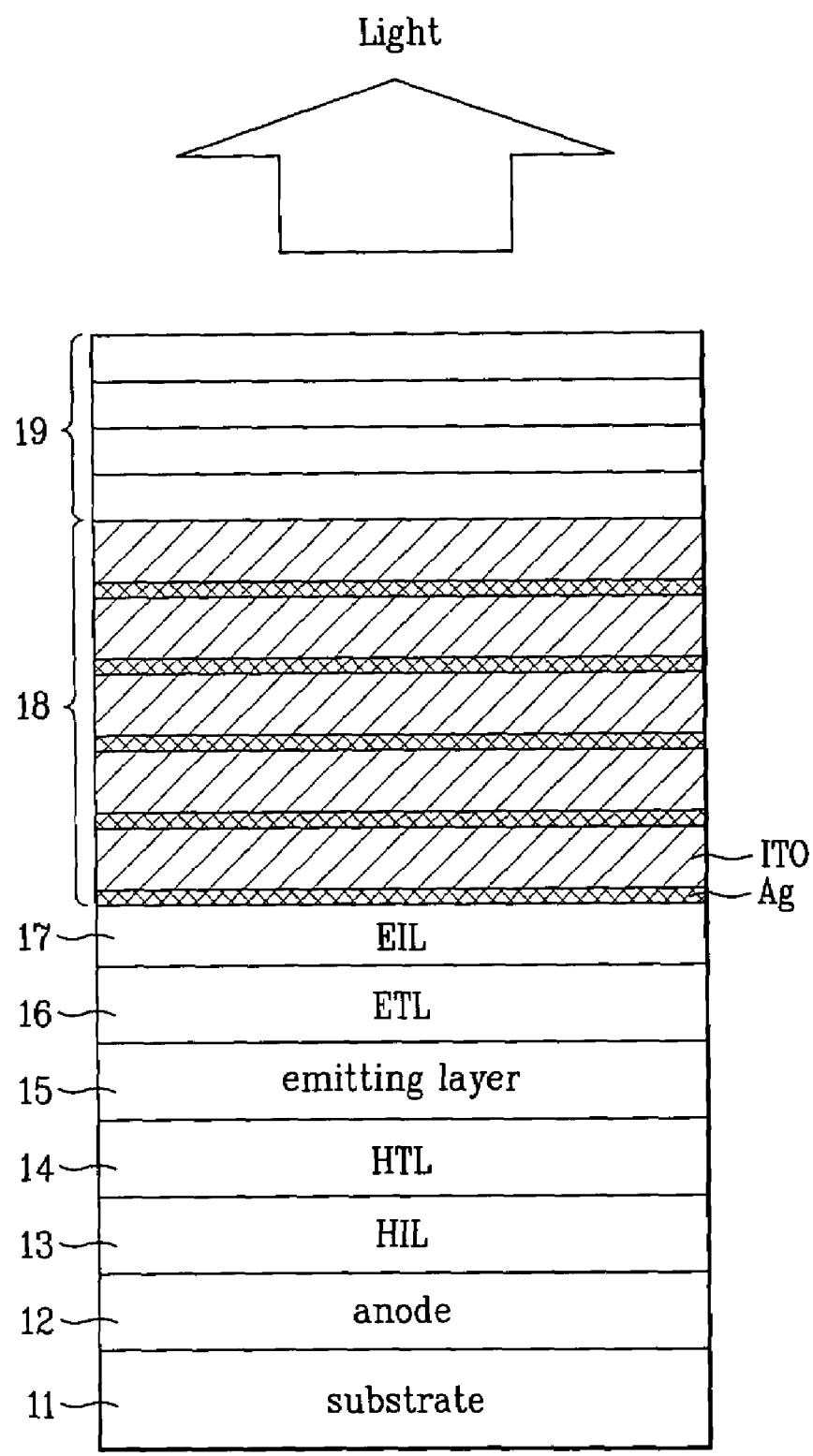
FIGS. 2–5 illustrate sections each showing a top emission type organic EL device in accordance with a preferred embodiment of the present invention.
Figure 3:
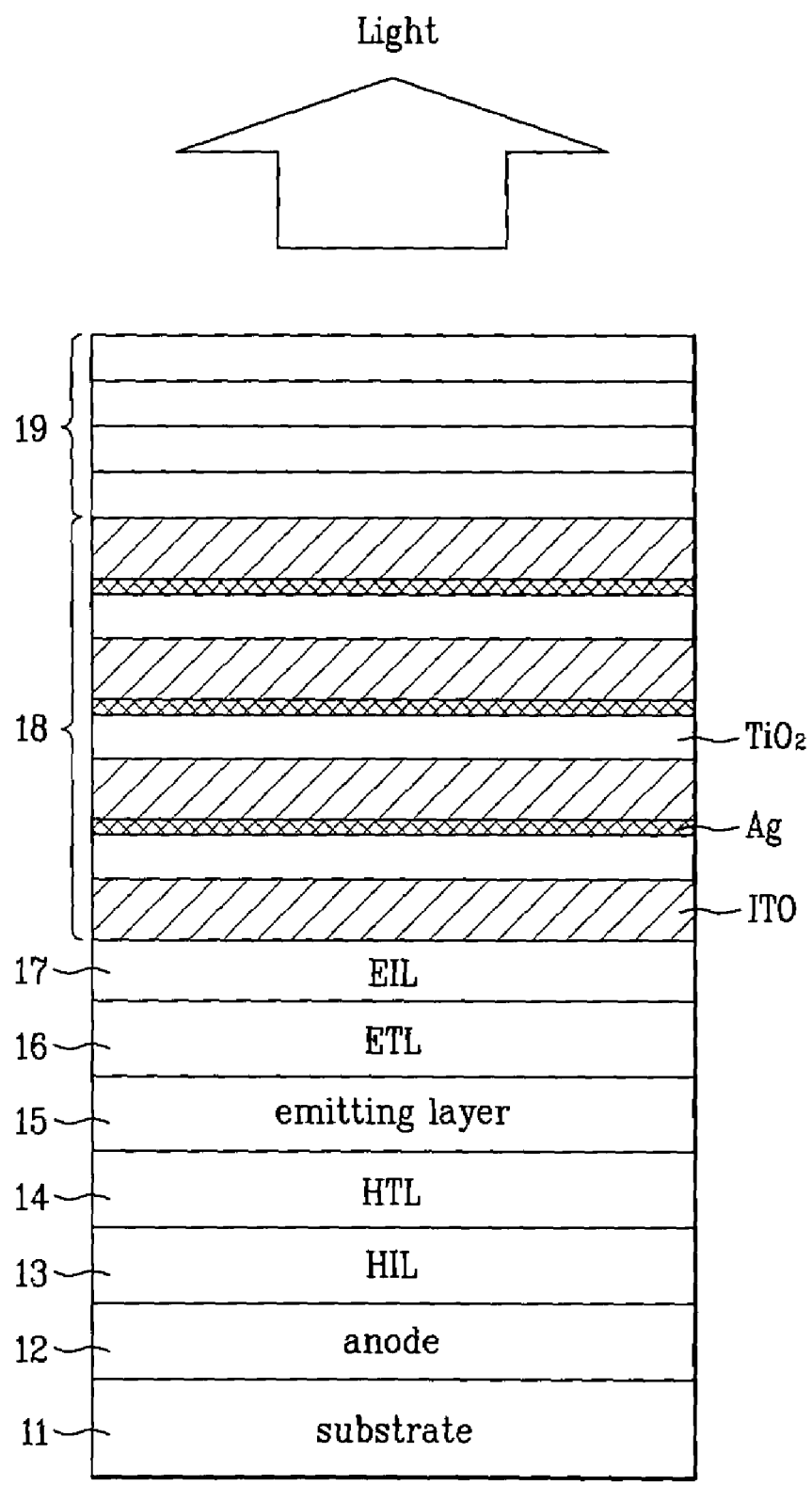
Figure 4:
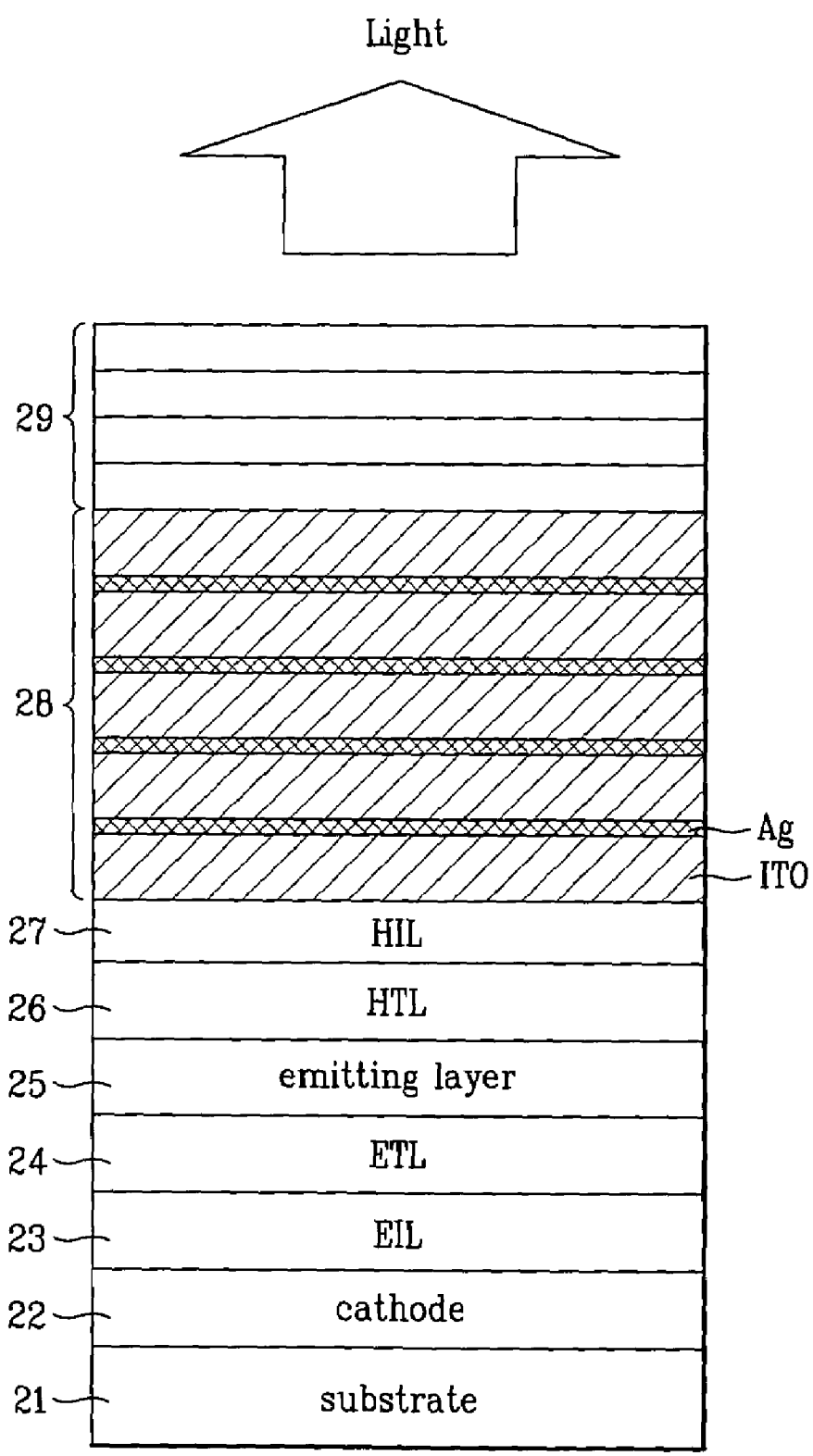
Figure 5:
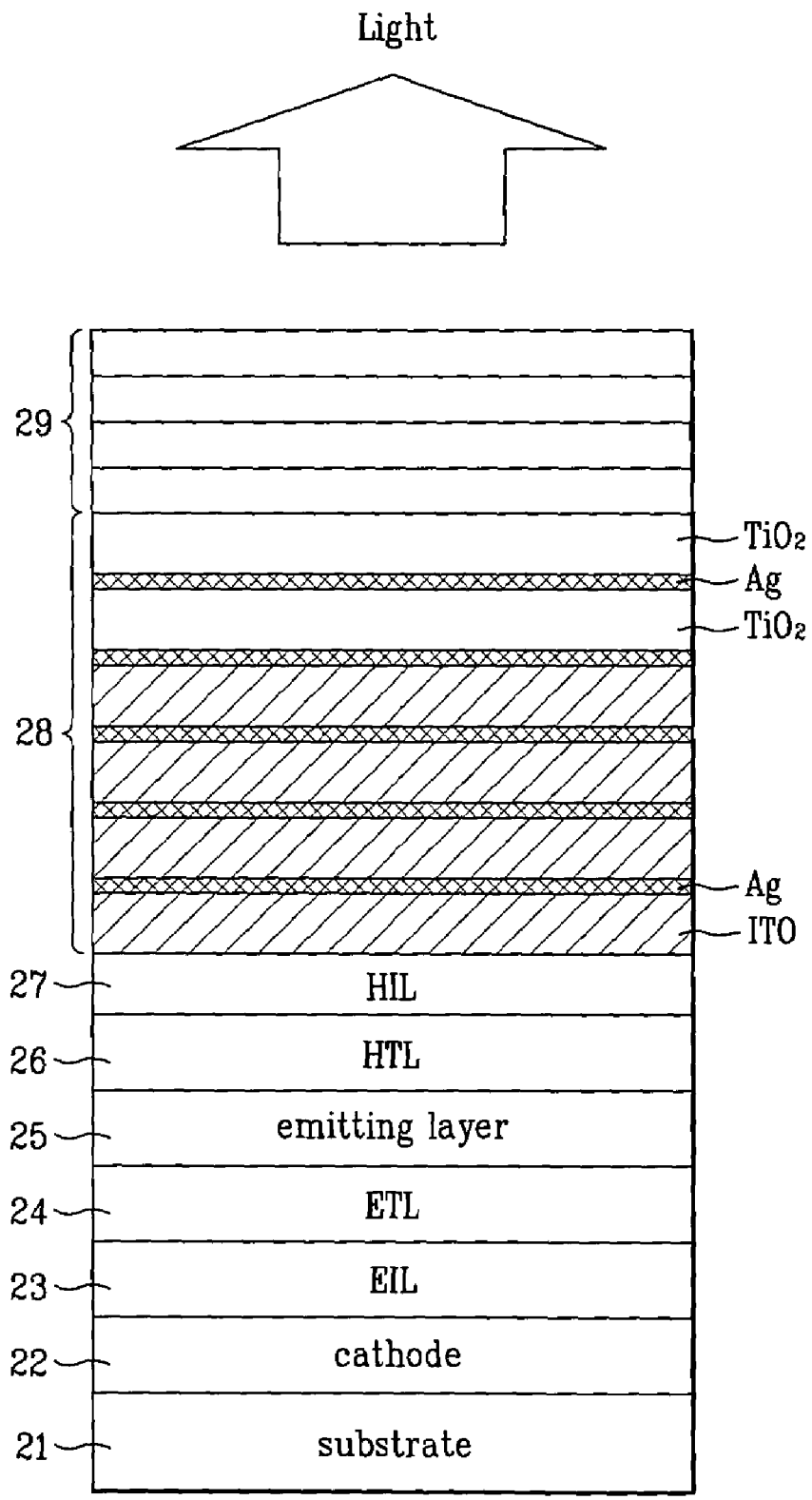

Reference will now be made in detail to the preferred embodiments of the present invention, examples of which are illustrated in the accompanying drawings. FIGS. 2–5 illustrate sections each showing a top emission type organic EL device in accordance with a preferred embodiment of the present invention, wherein FIGS. 2 and 3 illustrate devices in each of which first electrode is anode and a second electrode is a transparent cathode, and FIGS. 4 and 5 illustrate devices in each of which first electrode is cathode and a second electrode is a transparent anode.

Referring to FIGS. 2 and 3, an anode 12 is formed on a substrate 11. The anode 12 is formed of approx. 100 mm thick ITO. An HIL 13 and an HTL 14 are formed on the anode 12 in succession. The HIL is formed of approx. 25 nm thick CuPc or the like, and the HTL 14 is formed of approx. 35 nm thick NPD.

Then, an emitting layer 15 is formed on the HTL 14. In this instance, a green emitting layer is formed of approx. 25 nm thick 8-hydroxyquinoline aluminum (Alq3) doped with Co6 in a range of 1%.

Next, an ETL 16 and an EIL 17 are formed on the emitting layer 15. The ETL 16 is formed of approx. 35 nm thick Alq3, and the EIL 17 is formed of approx. 0.5 nm $Li_2O$.

Then, a cathode 18 is formed on the EIL 17. In this instance, the cathode 18 is an alternate stacking of a first layer of a metal and a second layer of a transparent thin film material.

The metal of the first layer may be selected from Ag, Al, Cr, Mo, Au, Pt, Sn, Ln, and Mg, and alloys such as Al:Li, Ag:Mg, Ag:Li and the like. The transparent thin film material of the second layer may be selected from oxides of ITO, IZO, $TiO_2$, and $SiO_2$, or nitride of $Si_3N_4$.

A total number of the alternate stacking of the layers may be in a range of 1–100. Thus, the cathode has multiple layers because of the following reasons.

For an example, when ITO has a transmittivity of approx. 90%, approx. 10 nm thick Ag has a transmittivity of approx. 65%, and approx. 5 nm thick Ag has a transmittivity of approx. 95%.

If the cathode has the same electric conductivity, the cathode of Ag (10 nm)/ITO (100 nm) has a transmittivity of approx. 0.585 (0.65×0.90=0.585), and the cathode of Ag(5 nm)/ITO(50 nm)/Ag(5 nm)/ITO(50 nm) has a transmittivity of approx. 0.73 (0.95×0.90× 0.95×0.90=0.73). Thus, it can be noted that the cathode with multiple layers improves electrooptical characteristics. And, when the cathodes have the same thickness and specific resistance, the multiple layered cathode has an increased transmittivity.

For an example, the transmittivity of the cathode increases depending on a number of the Ag layers, and a transmittivity spectrum of the cathode differs depending on a thickness distribution of the Ag layers.

Eventually, in the preferred embodiment of the present invention, the cathode 18 has the following structure.

That is, the cathode of the present invention has 10 layers of Ag(2 nm)/ITO(20 nm)/Ag(2 nm)/ITO(20 nm)/Ag(2 nm)/ITO(20 nm)/Ag(2 nm)/ITO(20 nm)/Ag (2 nm)/ITO(20 nm). In this instance, the cathode has a transmittivity of approx. 80%, with a good electric conductivity.

The cathode of the present invention may have a structure as shown in FIG. 3 for prevention of surface random reflection and moisture. That is, the cathode may have a total 10 layers of ITO(20 nm)/$TiO_2$(10 nm)/Ag(2 nm)/ITO(20 nm)/$TiO_2$(101 nm)/Ag(2 nm)/ITO(20 nm)/$TiO_2$(10 nm)/Ag(2 nm)/ITO(20 nm).

After the transparent cathode 18 is formed in the foregoing structure, a multilayered protection film 19 is formed on the cathode 18 for prevention of infiltration of gas.

The protection film 19 has a stack of four transparent thin film layers. The first layer of the protection film 19 is formed of a material selected from polymers including fluorine, such as polychlorotrifluoroethylene, or polydichlorotrifluoroethylene. Or, as the material of the first layer, copolymer of the polychlorotrifluoroethylene, and polydichlorotrifluoroethylene may be used. The material of the first layer is formed by PVD (physical vapor deposition).

Other than above material, a material may be used, which is selected from stearly acrylate, lauryl acrylate, 2-phenoxyethyl acrylate, isodecyl acrylate, isooctyl acrylate, iso bornly acrylate, 1,3-butylene glycol acrylate, 1,4-butanediol diacrylate, 1,6-hexanediol diacrylate, ethoxylated bisphenol A diacrylate, propoxylated neophentyl glycol diacrylate, tris (2-hydroxylethyl) isocyannurate triacrylate, and trimethylolpropane triacrylate.

The second layer of the protection film 19 may be formed of silicon compound of SiC, SiO, $SiO_2$, and $Si_xN_y$, of which $SiO_2$, and $Si_xN_y$ are preferable.

As a material of the third layer of the protection film 19, sealant of epoxy group, acryl group, and silicon compound are suitable for a material for reducing stresses of the first layer and the second layer of the protection film 19, and having mechanical properties and characteristics of a protection film.

Of the materials, trimethylacrylate, such as trimethyl propane triacrylate, and ditrimethylolpropane tetraacrylate, in an expoxy group, long chained acrylate, such as 1,6-hexanediol-diacrylate, and 1,6-hexanediol dimethacrylate, and the like is suitable.

For forming a perfect transparent layer, a sealant of an Si-compound is suitable, of which RT-glass, Si-sealant, and the like, which are room temperature setter, are preferred. The silicon-compound is formed by spray, spin coating, or Dr. blade.

Lastly, the fourth layer of the protection film 19 is formed of PET, PMMA, or a fluorine group polymer, for prevention of gas permeation of atmosphere and having mechanical properties.

FIGS. 4 and 5 illustrate devices in each of which first electrode is cathode and a second electrode is a transparent anode. The embodiments shown in FIGS. 4 and 5 use materials the same with the embodiments shown in FIGS. 2 and 3, of which detailed description will be omitted.

Referring to FIGS. 4 and 5, a cathode 22 is formed on a substrate 21. The cathode 22 is formed of approx. 200 nm thick Al or Ag.

Then, alike to the embodiments shown in FIGS. 2 and 3, an EIL 23 and an ETL 24 are formed on the cathode 22 in succession.

Then, an emitting layer 25, an HTL 26, and an HIL 27 are formed on the ETL 24 in succession.

Then, a transparent anode 28 is formed on the HIL 27. The anode 28 includes alternate stacking of a first layer of a metal, and a second layer of a transparent thin material. The metal of the first layer may be selected from Ag, Al, Cr, Mo, Au, Pt, Sn, Ln, and Mg, and alloys such as Al:Li, Ag:Mg, Ag:Li and the like. The second layer of a transparent thin film material may be formed of an oxide, such as ITO, IZO, $TiO_2$, $SiO_2$, and the like, or a nitride, such as $Si_3N_4$.

A total number of multiple layers of the anode may be approx. 1–100. It can be noted that the multiple layers of anode improves electrooptic characteristics of the anode.

Eventually, in the preferred embodiment of the present invention, the anode 28 has the following structure.

That is, the anode of the present invention has 9 layers of ITO(20 nm)/Ag(2 nm)/ITO(20 nm)/Ag(2 nm)/ITO(20 nm)/Ag(2 nm)/ITO (20 nm)/Ag(2 nm)/ITO(20 nm). In this instance, the anode has a transmittivity of approx. 80%, with a good electric conductivity.

The anode of the present invention may have a structure as shown in FIG. 5 for prevention of surface random reflection and moisture. That is, the anode may have a total 11 layers of ITO(20 nm)/Ag(2 nm)/ITO(20 nm)/Ag(2 nm)/ITO(20 nm)/Ag (2 nm)/ITO(20 nm)/Ag(2 nm)/TiO$_2$(10 nm)/Ag(2 nm)/TiO$_2$(10 nm).

After the transparent anode 28 is formed in the foregoing structure, a multilayered protection film 29 is formed on the anode 28 for prevention of infiltration of gas.

The protection film 29 has a stack of four transparent thin film layers. Since materials of the projection film are the same with the embodiment shown in FIG. 2, detailed description of which will be omitted.

As has been described, because an electrode is formed by stacking a plurality of transparent thin film layers, the electrode can be formed even at a low temperature, and improve electrooptic characteristics.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence (EL) device, comprising:
   a substrate;
   a first electrode on the substrate;
   an organic emitting layer on the first electrode; and
   a second electrode on the organic emitting layer;
   wherein the second electrode comprises a plurality of sets of stacked layers, each of the plurality of sets of stacked layers comprising at least a first layer of a metal, and a second layer of a transparent material; and
   wherein each set of stacked layers is formed directly on an adjacent set of stacked layers such that a first layer is positioned between respective second layers of adjacent sets of stacked layers.

2. The device as claimed in claim 1, wherein the first electrode is formed of a material selected from the group consisting of ITO, Al, and Ag.

3. The device as claimed in claim 1, wherein the organic emitting layer includes a stack of a hole injecting layer, a hole transport layer, an emitting layer, an electron transport layer, and an electron injecting layer formed on the first electrode or the second electrode in succession.

4. The device as claimed in claim 1, wherein the first layer is formed of a material selected from Ag, Al, Cr, Mo, Au, Pt, Sn, Ln, Mg, Al:Li, Ag:Mg, or Ag:Li; and the second layer is formed of a material selected from ITO, IZO, TiO$_2$, SiO$_2$, or Si$_3$N$_4$.

5. The device as claimed in claim 1, wherein the plurality of sets of stacked layers of the second electrode includes less than or equal to 100 layers in total.

6. The device as claimed in claim 1, further comprising a protection film having at least one transparent thin film layer on the second electrode.

7. The device as claimed in claim 6, wherein the transparent thin film layer of the protection film includes four layers in total.

8. The device as claimed in claim 7, wherein the first layer of the protection film is formed of a material selected from a polymer having a fluorine, stearyl acrylate, lauryl acrylate, 2-phenoxyethyl acrylate, isodecyl acrylate, isooctyl acrylate, iso bornly acrylate, 1,3-butylene glycol acrylate, 1,4-butanediol diacrylate, 1,6-hexanediol diacrylate, ethoxylated bisphenol A diacrylate, propoxylated neophentyl glycol diacrylate, tris(2-hydroxylethyl) isocyannurate triacrylate, or trimethylolpropane triacrylate; the second layer of the protection film is formed of a material selected from SiC, SiO, SiO$_2$, or Si$_x$N$_y$; the third layer of the protection film is formed of a sealant of a silicon compound of an expoxy group or an acryl group; and the fourth layer of the protection film is formed of a material selected from PET, PMMA, or a polymer having a fluorine group.

9. The device as claimed in claim 1, wherein a total number of the first and second layers in the two or more sets is ten.

10. The device of claim 1, wherein each first layer of each of the plurality of sets of stacked layers is of substantially the same thickness.

11. The device of claim 1, wherein each second layer of each of the plurality of sets of second layers is of substantially the same thickness.

12. The device of claim 1, wherein at least one of the plurality of sets of stacked layers comprises a second layer which includes a first transparent material layer and a second transparent material layer.

13. The device of claim 12, wherein the first transparent material of the second layer is different than the second transparent material of the second layer.

14. The device of claim 1, wherein each of the plurality of sets of stacked layers comprises a second layer which includes a first transparent material layer and a second transparent material layer, and wherein the first transparent material and the second transparent material are different from each other.

15. The device of claim 1, wherein each first layer of each of the plurality of sets of stacked layers is of substantially the same thickness.

16. An organic EL device comprising:
   a substrate;
   a first electrode on the substrate;
   an organic emitting layer on the first electrode;
   a second electrode comprising a plurality of layers, the plurality of layers forming an alternating stack of metal layers and a transparent thin film layers on the organic emitting layer such that transparent film layers are separated by a metal layer; and
   a protection film having a stack of at least one transparent thin film layer on the second electrode,
   wherein the second electrode comprises a plurality of said alternate stacks of said at least one metal layer and said at least one transparent thin film layer, and each alternate stack is formed directly on an adjacent alternate stack.

17. The device as claimed in claim 16, wherein the first electrode is formed of a material selected from the group consisting of ITO, Al, and Ag.

18. The device as claimed in claim 16, wherein the organic emitting layer includes a stack of a hole injecting layer, a hole transport layer, an emitting layer, an electron transport layer, and an electron injecting layer formed on the first electrode or the second electrode in succession.

19. The device as claimed in claim 16, wherein the metal layer of the second electrode is formed of a material selected from Ag, Al, Cr, Mo, Au, Pt, Sn, Ln, Mg, Al:Li, Ag:Mg, or Ag:Li; and the transparent thin film layer is formed of a material selected from ITO, IZO, $TiO_2$, $SiO_2$, or $Si_3N_4$.

20. The device as claimed in claim 16, wherein the second electrode includes 1–100 layers in total.

21. The device as claimed in claim 16, wherein the transparent thin film layer of the protection film includes four layers in total.

22. The device as claimed in claim 16, wherein the first layer of the protection film is formed of a material selected from a polymer having a fluorine, stearyl acrylate, lauryl acrylate, 2-phenoxyethyl acrylate, isodecyl acrylate, isooctyl acrylate, iso bornly acrylate, 1,3-butylene glycol acrylate, 1,4-butanediol diacrylate, 1,6-hexanediol diacrylate, ethoxylated bisphenol A diacrylate, propoxylated neophentyl glycol diacrylate, tris(2-hydroxylethyl) isocyannurate triacrylate, or trimethylolpropane triacrylate; the second layer of the protection film is formed of a material selected from SiC, SiO, $SiO_2$, or $Si_xN_y$; the third layer of the protection film is formed of a sealant of a silicon compound of an expoxy group or an acryl group; and the fourth layer of the protection film is formed of a material selected from PET, PMMA, or a polymer having a fluorine group.

23. The device as claimed in claim 16, wherein a total number of said at least one metal layer and said at least one transparent thin film layer of the plurality of said alternate stacks is ten.

24. The device of claim 16, wherein each of the metal layers are of substantially equal thickness.

25. The device of claim 16, wherein each of the transparent thin film layers are of substantially equal thickness.

26. An organic EL device comprising:
a substrate;
a first electrode on the substrate;
an organic emitting layer on the first electrode;
a second electrode having a plurality of alternate stacks, wherein each of the plurality of alternate stacks includes at least one metal layer and at least one transparent thin film layer on the organic emitting layer; and
a protection film on the second electrode having a stack of at least one transparent thin film layer,
wherein each alternate stack is formed directly on an adjacent alternate stack such that a metal layer is interposed between respective transparent thin film layers of adjacent alternate stacks.

27. The device as claimed in claim 26, wherein a total number of said at least one metal layer and said at least one transparent thin film layer of the plurality of alternate stacks is ten.

28. The device of claim 26, wherein each at least one metal layer of the plurality of alternate stacks is of substantially equal thickness.

29. The device of claim 26, wherein each at least one transparent thin film layer of the plurality of alternate stacks is of substantially equal thickness.

* * * * *